United States Patent
Kupce

(10) Patent No.: US 6,888,348 B2
(45) Date of Patent: May 3, 2005

(54) DECOUPLING SIDEBAND RESOLVED NMR SPECTROSCOPY (DESIRE)

(75) Inventor: Eriks Kupce, Oxford (GB)

(73) Assignee: Varian, Inc., Palo Alto, CA (US)

( * ) Notice: Subject to any disclaimer, the term of this patent is extended or adjusted under 35 U.S.C. 154(b) by 231 days.

(21) Appl. No.: 10/432,564

(22) PCT Filed: Nov. 28, 2001

(86) PCT No.: PCT/US01/44496

§ 371 (c)(1),
(2), (4) Date: May 22, 2003

(87) PCT Pub. No.: WO02/44747

PCT Pub. Date: Jun. 6, 2002

(65) Prior Publication Data

US 2004/0056659 A1 Mar. 25, 2004

Related U.S. Application Data

(60) Provisional application No. 60/250,792, filed on Dec. 1, 2000.

(51) Int. Cl.[7] ................................................. G01V 3/00
(52) U.S. Cl. ....................................... 324/307; 324/309
(58) Field of Search ................................. 324/307, 309, 324/311, 318

(56) References Cited

U.S. PATENT DOCUMENTS

| | | | | |
|---|---|---|---|---|
| 6,133,736 A | * | 10/2000 | Pervushin et al. | 324/307 |
| 6,184,683 B1 | * | 2/2001 | Emsley et al. | 324/309 |
| 6,396,257 B1 | * | 5/2002 | Baum et al. | 324/158.1 |
| 6,404,197 B1 | * | 6/2002 | Anderson et al. | 324/311 |
| 6,472,870 B1 | * | 10/2002 | Bendall et al. | 324/307 |

OTHER PUBLICATIONS

Article by Kupce et al., entitled Suppression of Cycling Sidebands Using Bi–Level Adiabatic Decoupling, published by Journal of Magnetic Resonance, Series A 122, pp. 81–84 (1996).

Book by Ray Freeman, entitled "Spin Choregography" published by Spektrum, Oxford, 1997.

Article by Shaka et al., entitled "Evaluation of a New Broadband Decoupling Sequence: WALTZ–16", published by Journal of Magentic Resonance, 53, pp. 313–340, (1983).

Article by Starcuk, Jr., et al., entitlted Heteronuclear Broadban Spin–Flip Decoupling with Adiabatic Pulses, published by Journal of Magnetic Resonance, Series A 107, pp. 24–31 (1994).

Article by Hwang, et al., entitled Reduction of Sideband Intensities in Adiabatic Decoupling Using Modulation Generated Through Adiabatic R–Variation (MGAR), published by Journal of Magnetic Resonance Series A 121 pp. 221–226 (1996).

(Continued)

*Primary Examiner*—Brij B. Shrivastav
(74) *Attorney, Agent, or Firm*—Bella Fishman; Edward H. Berkowitz

(57) ABSTRACT

Cycling sidebands arising from broadband decoupling of I-S heteronuclei are separated from the decoupled I spectra investigated in a 2D pulse sequence wherein I excitation 50 is followed after the interval $\delta+t_1$ with refocusing $\pi$ pulse 54 operating on the I spins. After I excitation 50, the $J_{IS}$ coupling is inverted by $\pi$ pulse 52 and immediately following the $\pi$ pulse 54, decoupling 56 is turned on and maintained while signal acquisition in the interval $t_2$ is initiated at $\delta+t_1$ after pulse 54. Double FT yields a 2D spectrum with sidebands completely displaced to diagonal locii, or alternatively the time domain data may be accumulated into respective t2 locations by effectively summing over t1 to yield a single dimensional spectrum free of cycling sidebands.

8 Claims, 3 Drawing Sheets

OTHER PUBLICATIONS

Article by Robert W. Dykstra entitled "A Method to Supress Cycling Sidebands in Broadband Decoupling", published by Journal of Magnetic Resonance 82, pp. 347–351 (1989).

Article by Kupce et al., entitled "Compensation for Spin–Spin Coupling Effects during Adiabatic Pulses", published by Journal of Magnetic Resonance 127, pp. 36–48 (1997).

Article by Freeman et al., entitled "Decoupling: Theory and Practice", published by NMR in Biomedicine, vol. 10, pp. 372–380 (1997).

Article by Kupce et al., entitled "Adiabatic Pulses for Wideband Inversion and Broadband Decoupling", published by Journal of Magnetic Resonance, Series A 115, pp. 273–276 (1995).

Article by Freeman et al., entitled "Suppression of Artifacts in Two–Dimensional J Spectra", published by Journal of Magnetic Resonance 43, pp. 484–487 (1981).

Article by Zhang et al., entitled "Synchronized Adiabatic Decoupling", published by Journal of Magnetic Resonance 147 pp. 110–115 (2000).

* cited by examiner

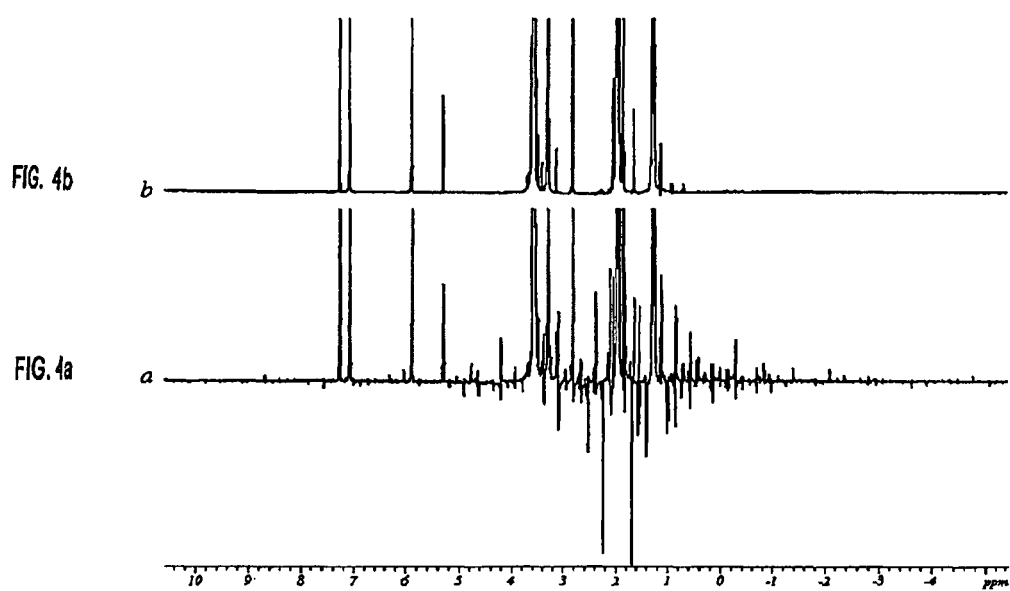
FIG. 4b
FIG. 4a
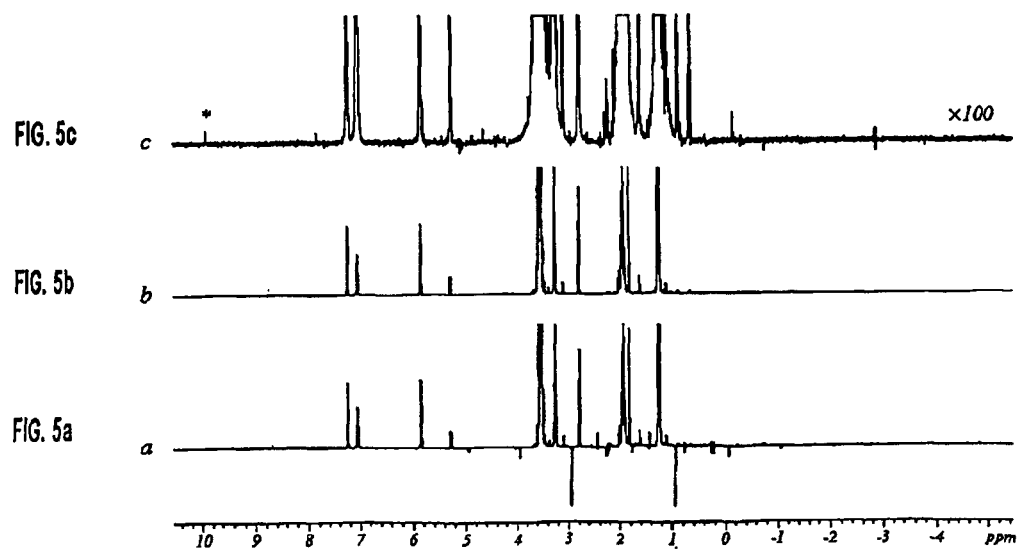
FIG. 5c
FIG. 5b
FIG. 5a

DECOUPLING SIDEBAND RESOLVED NMR SPECTROSCOPY (DESIRE)

This application claims the benefits of Prov. 60/250,792 filed Dec. 01, 2000.

FIELD OF THE INVENTION

The invention is in the field of magnetic resonance phenomena and particularly relates to reduction of complexity due to artifact in nuclear magnetic measurements.

BACKGROUND OF THE INVENTION

For all but the simplest of samples, NMR spectroscopy yields spectral distributions of considerable complexity. One aspect of this complexity arises from the interaction of nuclear spins among themselves, e.g., coupling of spins to yield a resultant angular momentum. Spin decoupling is the generic method of reducing this complexity of NMR spectra so that the chemical shift of one nuclear species may be observed without spectral effects due to another nuclear species.

A simple example of the decoupling problem and practice is to be found in the heteronuclear molecule. By convention, the (non-zero spin) nuclear constituents I and S are present and it is desired to study the spectral distribution of the I spins without the spectral complications arising from scalar coupling of the S spins to the I spins. Decoupling is achieved if, while observing the I spins, the S spins are repeatedly inverted. Ideally, if this exchange of S spin states is carried out rapidly in comparison with the I-S coupling, the spin-spin coupling will vanish.

In modem approaches to decoupling, the S spins are irradiated with modulated rf pulses in accord with any of several recognized techniques. One class of such pulses are realized as composite pulses, i.e. a sequence of phase shifts over appropriate durations to impose a desired corresponding sequence of rotations of the S spins. Adiabatic sweep pulses are another form of obtaining the desired inversion operation for decoupling the (S) spins. For this purpose, the effective field, $B_{eff}$ is rotated through an angle $\theta$ with respect to the x axis over the range $\pi/2 \leq \theta \leq -\pi/2$ such that $d\theta/dt << \gamma B_{eff}$. These pulse decoupling operations are implemented over a separate RF channel, e.g., independent of the observe channel. This pulse decoupling is generically referenced herein as "decoupling radiation" and with careful design the operation may yield effective decoupling over a wide spectral range (broadband decoupling). It is emphasized that the present invention may be practiced with a wide variety of prescriptions for this decoupling radiation and the invention is not to be confused with a particular type of decoupling radiation. Broadband decoupling is generally described by R. Freeman, "Spin Choreography," chpt. 7, Oxford Univ. Press, Oxford (1997).

Inasmuch as these broadband decoupling techniques comprise cyclic modulated sequences of pulses, artifact in the form of cyclic sidebands will appear in the decoupled spectrum (observe channel) of the instrument at the cycling rate and its harmonics. A number of approaches to suppression of these cycling sidebands have been employed in the prior art. The degree of suppression for these sidebands represents a limit to the examination of true, but weak signals.

One prior art method of sideband suppression applies adiabatic inversion to the (S) spins during the interval between excitation and refocusing of the I spins, and again after refocusing of the I spins through the acquisition of the I spectra. Sideband suppression is achieved coherently by incrementing the delay between decoupling and acquisition. Representative discussion may be found in the references: Ē. Kupče, J. Magn. Reson. 129, 219 (1997); R. Freeman and Ē. Kupče, NMR Biomed. 10, 372 (1997); Ē. Kupče and R. Freeman, J. Magn. Reson. A 115, 273 (1995).

It is known in prior art to suppress decoupling sidebands by decoupling at two different power levels. A high power spin-lock is applied at the beginning of the decoupling sequence. The sidebands are suppressed coherently by increasing the spin-lock time in small increments. See Ē. Kupče, R. Freeman, G. Wider, and K. Wuethrich, J. Magn. Reson. A 122, 81(1996).

It is known to apply decoupling radiation during acquisition of the signal asynchronously throughout the acquisition period. Dispersive components are also removed and spectral distortions are minimized. While a very simple approach, sideband suppression is ordinarily no more than a factor of two by this method. A similar prior art method permutes pulses of the composite pulse decoupling. Although a relatively high degree of sideband suppression is obtained, this is a one dimensional technique, limited to composite pulse decoupling, that randomizes the distribution of the sidebands rather than suppressing them coherently. A. J. Shaka, J. Keeler, and R. Freeman, J. Magn. Reson. 53, 313 (1983). Other methods employ a dispersion of sidebands over a restricted spectral region. A suppression factor of 5–10 may be achieved in favorable situations. See Z. Starčuk, Jr., K. Bartušek, and Z. Starčuk, J. Magn. Reson. A 107, 24 (1994); T.-L. Hwang, M. Garwood, A. Tannus, and P. C. M. vanZijl, J. Magn./Reson. A 121,221 (1996); R. W. Dykstra, J. Magn. Reson. 82, 347 (1989).

SUMMARY OF THE INVENTION

In the present invention, cycling sidebands arising from a periodic modulation technique in a decoupling channel of an RF apparatus are displaced from the main spectrum in a two dimensional technique. The suppression technique of the invention allows the magnetization from the cycling sidebands to evolve during the $t_1$ interval without any concomitant evolution of the magnetization from the parent peaks. This is achieved by a 180° pulse on the I spins that brings all chemical shifts to a focus at the end of the evolution period. Signal acquisition takes place during the interval $t_2$ under broadband decoupling conditions where both the parent and sideband signals evolve together. The elemental pulse sequence consists of 90ϕ-Δ-180x-Δ-acquire in the observe channel with 180x applied to the S spins at Δ/2 and the desired decoupling radiation applied to S spins at the conclusion of the $\pi_x$ pulse applied to the observed (I) spins and maintained throughout the acquisition interval $t_2$. A conventional phase cycle ϕ=−x, +x, +y, −y performed with opposite receiver accumulation phases set. The quantity $\Delta = \delta + t_1$ represents the indirect dimension with the variation of $t_1$. After double fourier transformation ($t_2, t_1 \rightarrow F_2, F_1$) the cycling sidebands will be found displaced in the $F_1$ dimension symmetrically about the parent spectrum at $F_1$=0.

BRIEF DESCRIPTION OF THE FIGURES

FIG. 4a is a spectrum of a sample using the invention.

FIG. 4b is a spectrum of the same sample as in FIG. 4a using conventional GARP-1 decoupling.

FIG. 5a is a spectrum of the sample obtained using adiabatic decoupling according to prior art.

FIG. 5b is the same as FIG. 5a using the present invention.

FIG. 5c is the spectral data of FIG. 5b on a x100 ordinate scale.

DETAILED DESCRIPTION OF THE INVENTION

Figure 1:
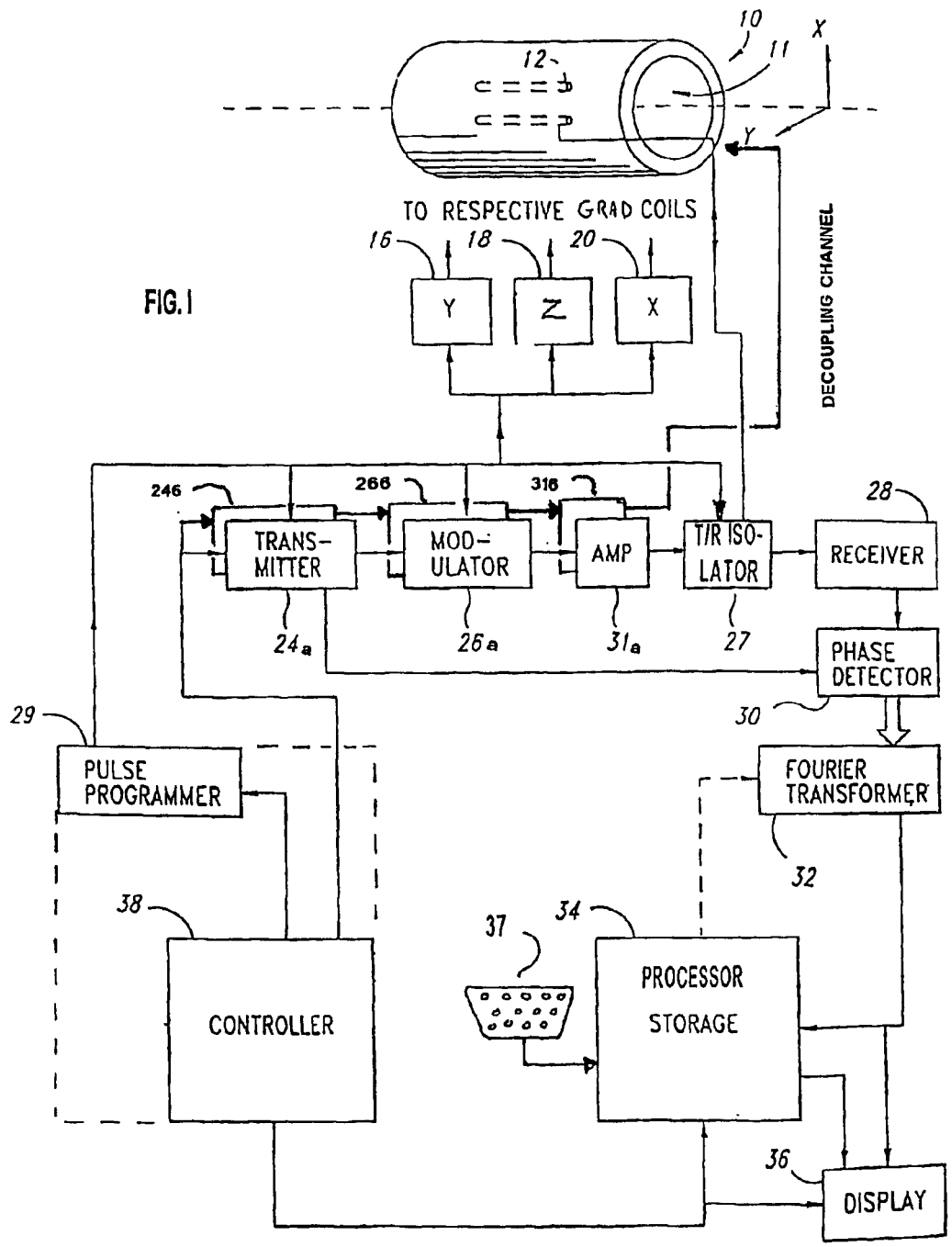
FIG. 1 is the context for the invention.

The physical context of the invention is an NMR apparatus. An idealized illustration is shown in FIG. 1. A magnet 10 having bore 11 provides a main magnetic field along the axis of the bore. In order to control the magnetic field with precision in time and direction for selected measurements, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneity in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through one or more transmitter coil(s) 12 in the interior of bore 11. Resonant signals are induced in a receiver coil, proximate the sample within bore 11. The transmitter and receiver coils may be the identical structure, or separate structures.

As shown in FIG. 1, RF power is provided from first transmitter 24a through modulator 26a, and is amplified by an amplifier 31a and then directed via transmit/receive (T/R) isolator 27 to the probe 12 that includes a first RF transmitter coil 12 located within the bore 11. The transmitter 24a may be modulated in amplitude or frequency or phase or combinations thereof, either upon generation or by a modulator 26a. The conceptual grouping of transmitter 24a, modulator 24a, amplifier 31a, T/R isolator 27 and the receiver is conventionally called the "observe channel". Additional transmitter 24b/modulator 26b/amplifier 31b components ("decoupler channel") are often employed to independently manipulate different gyromagnetic resonators coupled to the species under investigation. These independent spin manipulations are conveniently supported by multiple coils or a multi-resonant coil. Transmit and receive functions are not concurrently active in the observe channel. The identical coil 12 within the probe may be employed for both excitation and acquisition if so desired. Thus, the T/R isolator 27 is provided to separate the receiver from the transmitter 24a. In the case of separate transmitter and receiver coils, element 27 will perform a similar isolation function to control receiver operation.

The modulators 26a, b (or the equivalent) are responsive to controller 38 including pulse programmer 29 to provide RF pulses of desired frequency, amplitude, duration and phase relative to the RF carrier at pre-selected time intervals. The pulse programmer may have hardware and/or software attributes. The pulse programmer also controls the gradient power supplies 16, 18 and 20, if such gradients are required. These gradient power supplies may impose gradient pulses or maintain selected static gradients in the respective gradient coils if so desired.

The transient nuclear resonance waveform is processed by receiver 28 and ordinarily resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit of processor 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present the distribution for inspection.

Controller 38, most often comprising one or more digital processors, controls and correlates the time critical operations, such as the performance of pulse sequences in the observe channel and the decoupler channel. Controller 38 ordinarily incorporates an independent time base for maintaining synchrony with resonant spin systems. Overall operation of the entire apparatus within processor 34 includes input 37 from operating personnel, non-time critical calculation and output for further processing or display.

Figure 2:
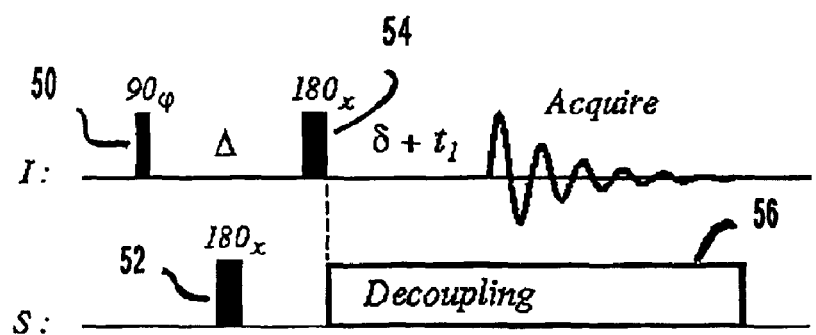
FIG. 2 shows a basic pulse sequence for practice of the invention.

Turning now to FIG. 2, the pulse sequence of the invention is shown. Following the excitation pulse 50 on I-spins, evolution of the hetero-nuclear spin-spin coupling ($J_{IS}$) is refocused by the first π-pulse 52 on S-spins. At the point where the $J_{IS}$ coupling is fully refocused a π-pulse 54 on I-spins is applied. Note that this pulse does not affect evolution of the $J_{IS}$ coupling. The purpose of this pulse is simply to refocus the I-spin chemical shift evolution. Just after the π-pulse on I-spins, hetero-nuclear S-spin decoupling 56 is switched on. During the following $t_1$ period the $J_{IS}$ coupling evolves in the presence of the decoupling field. The interval $\Delta=\delta+t_1$ is equal on either side of the 180° I pulse 54 with the constraint that the fixed delay $\delta$ is equal or greater than the width of the (preferably composite) 180° S pulse 52. That is, the frequency-modulated components of magnetization (the cycling sidebands) evolve and accumulate phase shifts that eventually determine the initial phases of the signals detected during the acquisition period. In complete contrast, the magnetization from the parent signals is refocused by the 180° pulse and starts the acquisition interval with zero phase shift, just as in a conventional pulse-acquire experiment. Consequently, in the resulting two-dimensional spectrum, the cycling sideband frequencies appear in the F1 dimension while the parent peaks are all confined to the trace at $F_1=0$. This essentially means that only evolution of decoupling sidebands is observed during the $t_1$ period. Once the chemical shift refocusing is accomplished the I-spin spectrum is acquired. Parent signals and decoupling sidebands both have evolved during $t_2$ with the consequence that the sidebands are dispersed along diagonals that pass through the corresponding chemical shift frequencies on the trace F1=0. Since the time-domain signals evolving during $t_1$ have no imaginary parts, the spectrum is symmetrical about the line F1=0, with the sidebands falling along two symmetrically related diagonals, reminiscent of those observed in "reflected" two-dimensional J spectra, as discussed for example in NMR Biomed. 10, 372 (1997) or J. Magn. Reson. A 115, 273 (1995). The inventive experiment is known by the acronym, as DESIRE—decoupling sideband-resolved spectroscopy.

Figure 3:
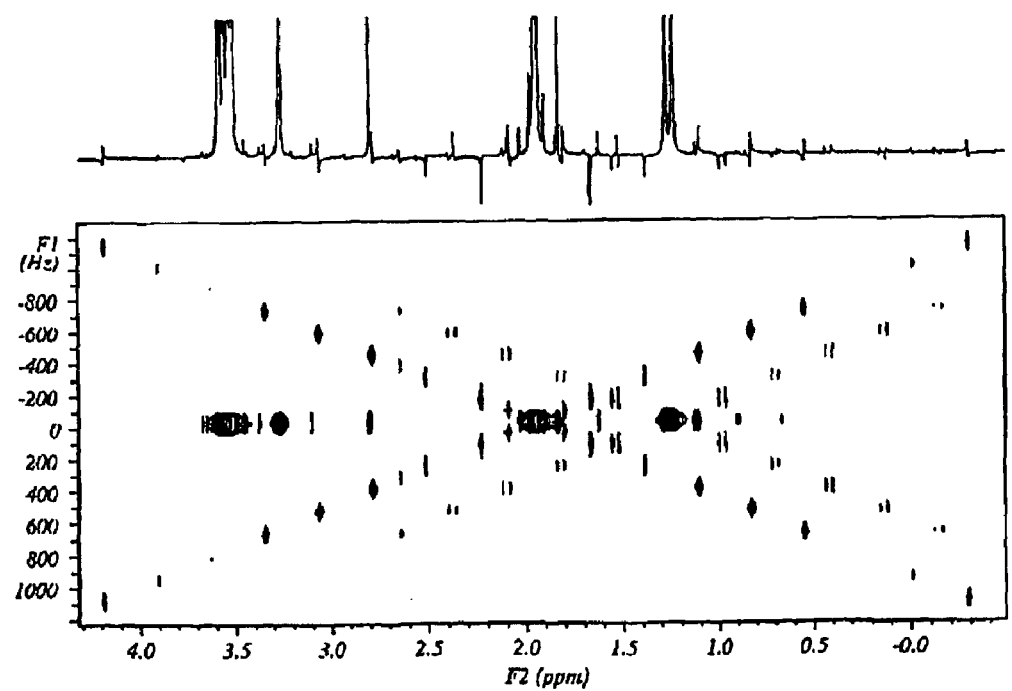
FIG. 3 shows a 2D spectrum of $^{13}CH_3I$ in $^{13}CH_3P(O)(OCH_3)_2$ in accord with the invention.

The technique was tested using a partially decomposed mixture of $^{13}CH_3J$ ($\delta_H$=1.95 ppm, $^1J_{CH}$=151 Hz), $^{13}CH_3P$ (O)(OCH$_3$)$_2$ ($\delta_H$=3.5 and 1.25 ppm, $^1J_{CH}$ =129 Hz), which contained a fair number of impurities. The 2D spectrum of this mixture recorded using the pulse sequence of FIG. 2 is shown in FIG. 3. This data was obtained at 500 MHz, in this case using the well known GARP-1 decoupling of $^{13}$C. The decoupled proton spectrum appears at F1=0 and the responses at 1.25 and 1.95 ppm are coupled to $^{13}$C. The indirect dimension (t1) was realized in 128 increments, each of which was phase cycled over 4 scans. The inversion pulse applied to S was a composite pulse comprising 90° (x) 180° (y) 90° (x). The strongest sidebands, appearing on F1 at +/−210 Hz from the main $^{13}$CHJ peak were phased by adjusting the value of the delay δ to 2.5 ms. The distribution along the top of the 2D spectrum is from the initial increment and shows the spectral complexity where sidebands are not suppressed.

The trace along the zero frequency in F1 represents a sideband free spectrum of the main resonances referred to as the main spectrum below. The peaks that appear at non-zero frequencies in F1 represent the decoupling sidebands. Their frequency in F1 corresponds to their relative distance from the parent peak in F2. Hence the decoupling sidebands show diagonal patterns that cross over at the position of the main peak. The cross peaks allow identification of any residual or partially suppressed sideband peaks that may appear in the main spectrum.

In FIG. 4 the main spectrum (b) from a DESIRE experiment of 128 transients (using conventional synchronous GARP-1 decoupling) is compared with a conventional synchronous GARP-1 decoupled spectrum (FIG. 4a). A dramatic reduction of sideband intensity has been achieved. Both spectra have been truncated at 2.5% of the most intense MeJ peak.

The degree of sideband suppression in the DESIRE experiment largely depends on a) the number of increments in $t_1$, b) the length of the decoupling sequence, c) length of individual (composite) inversion pulse in the decoupling sequence and d) overall stability of the system (hardware). In order to minimize relaxation losses, the delays Δ and $t_1$ need be as short as possible. A high degree of sideband suppression can be achieved if the $t_1$ is set to an integer multiple of the duration of decoupling sequence, including the phase cycle or supercycle. The optimum number of increments ($n_i$) is determined as:

$$n_i = 2kmN, \qquad (1)$$

where m is a positive integer, usually m=1, k is the number of phase cycling steps in the decoupling sequence, and N is a positive integer, a power of two, that corresponds to the highest order harmonic that needs to be eliminated. The time increment in F1 is calculated as $T_d/(2N)$, where $T_d$ is the length of a single (composite) inversion pulse in the decoupling sequence. It is known that sub-harmonic sidebands can only be eliminated if k is an even number. Hence the decoupling sequences employing some of the iterative phase cycling schemes where k is an odd integer may require doubling the number of increments (m=2) to achieve a complete elimination of sub-harmonic sidebands.

Cycling sidebands that are closer to the parent line are more difficult to eliminate and require longer to evolution times. The inner sidebands are typically caused by a poor inversion profile of the basic 180° pulse in the given decoupling sequence, or because of inaccurate calibration of the radio frequency field. Adiabatic pulses have the advantage of being less sensitive to radio frequency calibration errors. It is essential that the effective bandwidth of the 180°(S) pulse be at least as wide as those in the following decoupling sequence. Alternatively, the same pulses that are used for the S-spin decoupling can also be employed for refocusing $J_{IS}$, as described earlier: see J. Magn. Reson. 129, 219 (1997). This has the advantage of reducing some of the sidebands at the initial stage.

In addition to more conservative use of decoupling power, adiabatic decoupling has the advantage of producing cycling sidebands fewer than those of conventional decoupling schemes, giving a simpler DESIRE spectrum. The degree of sideband suppression achievable with adiabatic decoupling is shown in FIGS. 5a–c. A relatively long ($T_d$=2 ms) WURST-40 waveform covering a 20-kHz bandwidth and phase cycled according to the MLEV-4 scheme was employed to produce an extensive pattern of sidebands. This made genuine peaks in the spectrum from minor components essentially impossible to recognize (see FIG. 5a). Sidebands up to the fourth harmonic, N=4 were suppressed. A considerable improvement of sideband suppression was obtained by applying a sine-squared window function in the $t_1$ dimension. This required doubling the number of increments to n, =64 (m=2). In order to minimize the sub-harmonic sidebands, a 1-ms constant adiabaticity WURST-40 pulse was employed as the 180° pulse. A sideband-free spectrum obtained from the two-dimensional data set is shown in FIG. 5b. The vertical scale has been increased by a factor of 100. Only a few residual responses from the sidebands can be identified, the strongest of which is the eighth-order sideband marked by an asterisk (*). Its intensity is only 2.4×10$^{-5}$ of the main (CH$_3$I) peak, demonstrating a remarkable suppression factor of 1000.

From the example 2D spectrum of FIG. 3, it is apparent that a simple addition of frequency domain spectra for each symmetrical F1 value of $t_1$ will cancel various sidebands, while differential information carried by the F1 dimension is available until such spectral addition is carried out. In a more elegant manner, the 2D DESIRE experiment can easily be reduced in an operational sense to a one dimensional decoupled spectrum by simply accumulating corresponding time domain data of the 2D experiment in respective memory locations. This is equivalent to carrying out a summation over $t_1$ for the $t_2$ distribution, e.g., $\Sigma_{t_1}\{f(t_2)\}$. Only one fourier transform is thus required at the conclusion of the 2D experiment. This would also simplify the task of sideband suppression in more complex multidimensional experiments. One application of DESIRE involves dilute species, requiring extensive time-averaging, so there need be no increase in total spectrometer time.

To conclude, the inventive technique allows an extremely high degree of sideband suppression in decoupling experiments and provides the means to identify any incompletely suppressed sidebands in the final spectrum. The new method should be useful for detection of minor components in spectra of high dynamic range. Apart from slight loss due to spin-spin relaxation during the short interval 2Δ, the sensitivity should be comparable with that of conventional one-dimensional spectroscopy, and in any case, for decoupled spectra, it is the residual cycling sidebands (rather than noise) that often limit the effective sensitivity.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A pulse sequence method for discriminating between decoupled spectral entities in I-S heteronuclei and spin decoupling spectral artifact, comprising the steps of:

(a) at time t=0, exciting I spins by application of a 90° resonant pulse at phase $\phi$, (b) upon a delay of substantially $\Delta/2$, applying a $\pi^x_s$ pulse to S spins at phase x with respect to $\phi$, (c) upon a further delay of substantially $\Delta/2$, applying a $\pi^x_1$ pulse to said I spins at phase x with respect to $\phi$ and at the conclusion of said $\pi^x_1$ pulse, (d) directing decoupling radiation to said S spins and concurrently acquiring a time dependent waveform $f(t_2)$, and (e) at the conclusion of said acquisition, terminating said decoupling radiation, wherein $\Delta=\delta+t_1$ and $\delta$ is substantially equal to the duration of said $\pi^x_s$ pulse.

2. The method of claim 1 comprising repeating steps a–e wherein $t_1$ is first varied by a predetermined quantity for each repetition and the resulting data has the form $f(t_2, t_1)$.

3. The method of claim 2 further comprising double fourier transforming $f(t_2, t_1)$ to the frequency domain to obtain $G(\omega_2, \omega_1)$.

4. The method of claim 3 comprising identifying a slice $G(\omega_2)^{\omega_1=0}$ as decoupled spectrum of I spins.

5. The method of claim 1 comprising repeating steps a–e wherein $t_1$ is first varied by a predetermined each repetition and the resulting data has the form $\Sigma_{t_1}\{f(t_2)\}$.

6. The method of claim 1 wherein said decoupling radiation comprises adiabatic pulses.

7. The method of claim 1 wherein said decoupling radiation comprises composite pulses.

8. The method of claim 1 further comprising phase cycled repetition of steps (a) through (e) by incrementing $\phi$ to initate each excitation for respective phases $\phi$=−x, x, +y, −y and combining said now acquired data with previously acquired data by respective operations of addition, subtraction, addition and subtraction whereby said data acquisition is phase cycled.

* * * * *